United States Patent
MacKenzie et al.

(10) Patent No.: US 8,680,678 B2
(45) Date of Patent: Mar. 25, 2014

(54) FORMULATIONS FOR IMPROVED ELECTRODES FOR ELECTRONIC DEVICES

(75) Inventors: John Devin MacKenzie, Los Gatos, CA (US); Jian Ping Chen, Sunnyvale, CA (US)

(73) Assignee: Sumitomo Chemical Co., Ltd., Tokyo (JP)

( * ) Notice: Subject to any disclaimer, the term of this patent is extended or adjusted under 35 U.S.C. 154(b) by 678 days.

(21) Appl. No.: 12/791,627

(22) Filed: Jun. 1, 2010

(65) Prior Publication Data

US 2010/0301375 A1    Dec. 2, 2010

Related U.S. Application Data

(60) Provisional application No. 61/183,013, filed on Jun. 1, 2009, provisional application No. 61/183,003, filed on Jun. 1, 2009.

(51) Int. Cl.
*H01L 23/48* (2006.01)
*H01L 23/52* (2006.01)
*H01L 29/40* (2006.01)

(52) U.S. Cl.
USPC ........ 257/746; 257/734; 106/31.92; 252/500; 252/512

(58) Field of Classification Search
USPC .......................................... 252/512; 136/256
See application file for complete search history.

(56) References Cited

U.S. PATENT DOCUMENTS

| | | | |
|---|---|---|---|
| 2,726,222 A | 12/1955 | Palmquist et al. | |
| 5,682,043 A | 10/1997 | Pei et al. | |
| 5,688,441 A * | 11/1997 | Itagaki et al. | 252/514 |
| 5,734,225 A | 3/1998 | Biebuyck et al. | |
| 5,888,925 A | 3/1999 | Smith et al. | |
| 6,139,390 A | 10/2000 | Pothoven et al. | |
| 6,146,225 A | 11/2000 | Sheats et al. | |
| 6,268,695 B1 | 7/2001 | Affinito | |
| 6,365,036 B1 | 4/2002 | Polikarpus | |
| 6,605,483 B2 | 8/2003 | Victor et al. | |
| 6,635,989 B1 | 10/2003 | Nilsson et al. | |
| 6,887,733 B2 | 5/2005 | Klausmann et al. | |
| 2005/0227387 A1 | 10/2005 | Yokajty | |
| 2005/0230691 A1 | 10/2005 | Amiotti et al. | |
| 2005/0238803 A1 | 10/2005 | Tremel et al. | |
| 2006/0128042 A1 | 6/2006 | Gramann et al. | |
| 2006/0283546 A1 | 12/2006 | Tremel et al. | |
| 2008/0003493 A1 | 1/2008 | Bates | |
| 2008/0171801 A1 | 7/2008 | Cho et al. | |
| 2008/0187651 A1* | 8/2008 | Lee et al. | 427/77 |
| 2009/0167169 A1* | 7/2009 | Lee et al. | 313/504 |
| 2010/0270919 A1 | 10/2010 | Hubert et al. | |

OTHER PUBLICATIONS

International Search Report and Written Opinion issued on Aug. 30, 2010 for PCT Application No. PCT/US2010/036972.
International Search Report and Written Opinion issued on Dec. 19, 2011 for PCT Application No. PCT/US2010/036937.

* cited by examiner

*Primary Examiner* — Ha Tran T Nguyen
*Assistant Examiner* — Aaron Dehne
(74) *Attorney, Agent, or Firm* — David H. Jaffer; Pillsbury Winthrop Shaw Pittman LLP

(57) ABSTRACT

A conductive electrode paste or ink formulation including a getter removes or reduces the concentration of the unwanted impurities in an electronic device. These reductions may happen during or immediately after the fabrication or sealing of the device, or they may occur after some activation time or event. Water, oxygen, carbon dioxide, hydrogen, and residual solvents are gettered.

20 Claims, 1 Drawing Sheet

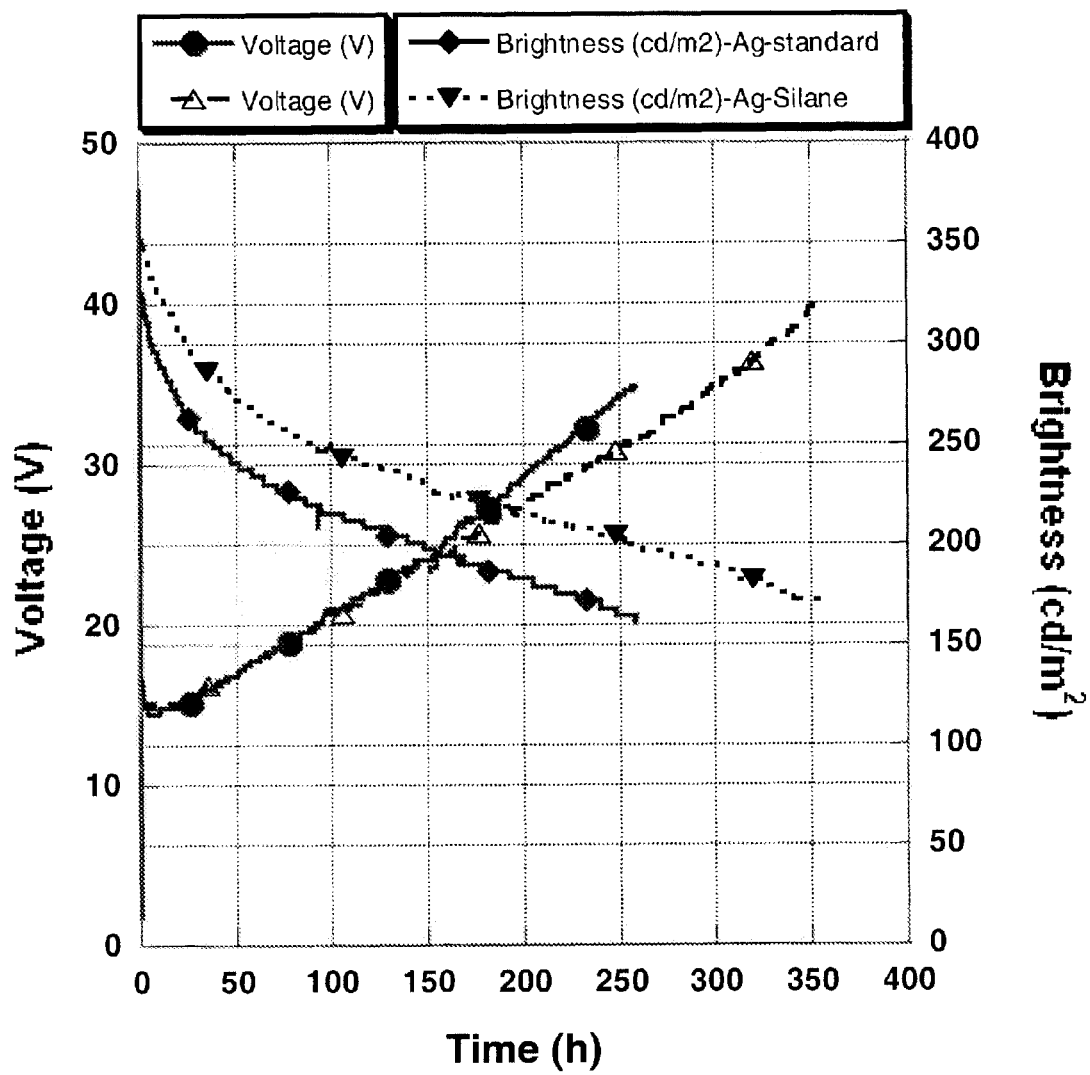

FORMULATIONS FOR IMPROVED ELECTRODES FOR ELECTRONIC DEVICES

CROSS REFERENCE TO RELATED APPLICATIONS

This application claims priority from U.S. Provisional Application Ser. Nos. 61/183,013 and 61/183,003 filed Jun. 1, 2009.

FIELD OF THE INVENTION

This invention relates to formulations of conductive inks and pastes that include gettering species for improved performance in electronic devices.

BACKGROUND OF THE INVENTION

Water, oxygen, and unwanted organic residues can be detrimental to semiconductor device operation or useful lifetime. This is specifically true in organic semiconductor-based devices such as organic light emitting devices or photoresponsive devices where water or oxygen can lead to electrode degradation or degradation of the active light emitting, absorbing, or charge transporting materials that are necessary for proper functioning of the device. In general, an electronic device includes the placement of conductive electrodes or isolated features along with dielectric or semiconducting materials. In the cases of typical organic light emitting devices or photoresponsive devices, active semiconducting and/or emissive, absorptive or charge transport materials are sandwiched between conductive electrodes that provide charge carrier injection or charge carrier extraction into or out of the active regions within the device. The electron injecting electrode is referred to as the cathode. In some organic light emitting devices, such as the doped organic light emitting device structures produced in U.S. Pat. No. 6,605,483, the device stack is formed with an underlying, semi-transparent, hole-injecting anode electrode arranged on a substrate, that might have water or oxygen barrier properties, followed by a layer of active material, and with a cathode electrode placed on top of and in direct contact with the active material. In some instances, this device is then encapsulated by deposition of thin barrier films on top of the cathode, or by sealing the device through the use of a barrier film and/or adhesive that is fixed to the cathode side of the device, thereby encapsulating the device and restricting the ingress of $O_2$ or $H_2O$ through the anode-side barrier substrate film and the topside encapsulation films. This process can also trap $O_2$, $CO_2$, $H_2$, $H_2O$, or other unwanted species that are present from the starting materials or introduced during the fabrication process into the interior of the device, where they could interact with the electrodes or active materials in the device.

Typical conductive paste components, in addition to the conductive materials themselves which might be metal flakes, particles, nanoparticles, nanotubes, organic conductors, or polymeric conductors, can be sources of residual water or impurities. For example, a conductive paste formulation might also include polymer or organic binder materials, such as polyesters, polyurethanes, conducting polymers, polythiophenes, polyanilines, or epoxies, that can contain residual water or other impurities, or it might attract, absorb, or produce residual unwanted impurities once printed onto the device. Other materials that could be sources of unwanted impurities in the ink include surfactants and additives, including ionic, nonionic, and amphiphilic agents, and impurities on particle surfaces or dispersed in the nonmetallic component of the ink or paste.

SUMMARY OF THE INVENTION

The present invention uses an included getter to remove or reduce the concentration of the unwanted impurities that are present in a conductive paste or ink formulation, or that are introduced into the paste or printed feature during the deposition process or prior to encapsulation of a device. The unwanted impurities can also be formed during device operation or be introduced into the device through ingress of materials from the environment. In one form of the invention, the gettering species are temporarily inactive, of reduced activity, or latent acting at the time of deposition. Gettering materials, such as those that remove, sequester, or convert $H_2O$, $CO_2$, $H_2$, $O_2$ or other unwanted species, can be included directly into the conductive ink or paste formulation such that these unwanted species are removed from the electrode formed by these inks or pastes, or these unwanted species are removed or are lowered in concentration in adjacent parts of the device or encapsulation package. These reductions may happen during or immediately after the fabrication or sealing of the device, or they may occur after some activation delay. In terms of duration, they may be used to remove initial residual unwanted gasses or impurities in the device or they may be used to remove unwanted species that appear in or near the device later in its product cycle, such as by ingress through the encapsulation materials or by outgassing, or by reactions that occur within the device or encapsulation materials themselves. Of particular interest are $H_2O$, $O_2$, $CO_2$, $H_2$, or residual solvent getter materials that primarily perform their function after the formation of a conductive feature using the ink, such that the materials remove the unwanted species at a time when those species are no longer intentionally present. For example, the getter material is present during the fabrication of the cathode for an organic light-emitting device or a photovoltaic or photoconductive device from printing or coating, but is able to perform its action after the initial fabrication step. In the present invention, getter that originates in the conductive paste that is not permanently saturated or consumed by exposure to $H_2O$, $O_2$ or solvents in the process environment, such as while processing in air from solvent-borne solutions.

IN THE DRAWING

FIG. 1 illustrates voltage (V) and brightness ($cd/m^2$) as a function of time for performance comparison between a standard silver cathode device and a silver-silane cathode device, tested at 2 $mA/cm^2$ current density in a nitrogen glove box.

DETAILED DESCRIPTION OF THE INVENTION

In the present invention, a gettering species is directly included in a conductive paste or ink formulation used as an electrode in an electronic device. The terms "paste" and "ink" are used interchangeably in this description to describe flowable solutions. The getter becomes active, is desaturable, or has sufficient capacity such that it acts after an air or process environment exposure step. This concept is generally applicable to electronic devices where conductive pastes or inks are used to form an electrode, and are particularly applicable to organic light-emitting diodes (OLEDs) and photovoltaic devices. The use of techniques to ensure that the getter material is at least temporarily inactive, of reduced activity, or latent acting at the time of deposition provides improved gettering function after the electronic device is encapsulated and activated. Thus, getter materials that may be activated after the paste is deposited and the electronic device encapsulated are particularly useful. Control of the activation of the getter materials may be achieved by using a number of techniques, for example, thermally, optically, electrically, through protection by a matrix that controls diffusion of the unwanted species to the getter material, or with a solvent that protects the getter until the solvent is removed in a later processing step such as heating or vacuum treatment (where the heating or vacuum treatment is in an environment free of unwanted species such as water, oxygen, and hydrogen). Some getters may also be reformed in a later step, such as silicon gel or some zeolites, such that water or other absorbed species in the getter can be driven off thermally or with vacuum or other means such that the getter is reactivated at a later stage.

In one embodiment, a silane-based getter additive that is thermally activated to react with water was shown to improve device performance. Another embodiment of the present invention is the inclusion of material in an electrode paste that converts $H_2O$, $O_2$, $CO_2$, $H_2$, or other impurities into a benign species which does not react adversely with device components. Another embodiment includes gettering materials that act latently or upon activation in a later processing step to convert an unwanted impurity, such as water, to a more volatile species, for example a lower alcohol via the hydrolysis reaction of a tetraethylorthosilicate additive at an elevated temperature, which is then more easily or more rapidly removed in a drying step than the original form of the unwanted species. This enables the faster removal of, for example, $H_2O$ which can require high temperatures, long dwell time or low vacuum levels for effective removal from active device materials. $H_2O$ and related impurities can be rate limiting steps for processes based on water-borne, hydrophilic or hygroscopic device materials such as conducting polymers (PEDOT:PSSA), electrolyte materials (such as ethylene oxides), dielectrics (such as polyvinylphenol, polymethylmethacrylate, sol gels, SiOx, silicon nitride). Therefore, increasing the ease of removal of these species improves processing throughput, lowers equipment cost and/or reaches desirable low impurity levels that are not be practically achievable due to the time/temperature limitations of other device materials. For example, the use of polyester plastic substrates limits safe process temperatures to below 200C and more typically below 170C for polyesterterapthalate.

A cathode paste in accordance with the present invention would preferably include at least one air-stable high work-function metal, at least one polymer binder, at least one alkoxysilane organic/inorganic moisture getter, at least one organic solvent, and at least one surfactant. Examples of suitable high work function materials for a cathode include silver, gold, aluminum, carbon (black, particles, nanotubes, fullerenes, graphite, graphene), tungsten, copper, chromium, nickel, and molybdenum. Examples of polymer binder materials in addition to those described earlier, include thermosets and thermoplastics, cellulose-derivative polymers, polyester copolymers, vinyls, methacrylates, silicones, and siloxanes. In some cases, fluorinated and partially fluorinated polymers may be desired for reduced affinity and permeability for water and less reactivity. Suitable organic solvents can be matched with process requirements and chosen from a wide variety of solvents. Examples of such solvents are carbitol acetates, ethyl acetates, butyl carbitol, butyl carbitol acetate, terpenes, higher alcohols, dibasic esters, and lactones. Many surfactants are also suitable, including ionic and nonionic surfactants, amphiphilic materials, fatty acids, oleic acids, alkylated carboxylic acids, ethoxypropyloxy copolymers, silicones and siloxane copolymers. If desired, matrix materials can be used for the purposes discussed earlier. Examples of suitable matrix materials are those used as binder materials.

Examples of the present invention are inks where the alkoxysilanes in the total cathode paste ratio can be from 0.01% to 10% by weight to provide the needed effect but avoiding impairment of cathode function. Generally it is also useful for plastic substrate-based devices to use a getter material that can be hydrolyzed in the temperature range from room temperature to 200 C. This concept includes use of other compounds such as those based on alkoxyl-substituted aluminum (III), antimony (III), barium (II), titanium (IV), or zirconium (IV). Thermally-, light- or time-activated organometallics are also useful as electrode getter additives.

Other embodiments include solvent or otherwise stabilized metal oxide particles (such as Ca, Ba, Sr, Mg or Si oxides or similar), highly porous oxides, nanosize particulate adsorbers, or zeolite particles such as aluminosilicates and their derivatives. For $H_2$ gettering, metal oxides such as PdO or PtO are useful. It is advantageous if these particles are of relatively small size (<100 microns in the x, y, z dimensions, more preferably <10 microns) such that they do not interfere with device operation or lead to larger cathode nonuniformities that can cause device operational non-uniformity or lead to electrical shorting of devices. The particles are preferably from 0.1% to 25% by weight of the total cathode paste. At too high a concentration the gettering materials can interfere with the electrical properties of the electrode.

Highly desiccating pastes can be formed with some of the above materials which use matrix and solvent effects to initially restrict their interaction with moisture during processing. Examples of matrix effects include the use of low solubility or permeability matrices to limit impurity ingress. Solvent effects can include the use of solvent vapor pressures in the vicinity of the liquid feature to block impurity ingress. This can allow for reasonable air processing windows for printable or dispensable pastes and wet or semi-wet printed films formed from them.

Furthermore, an attractive mode for encapsulating a device involves the use of gettering materials to remove $H_2O$, $CO_2$, $H_2$, $O_2$ or other unwanted species trapped in the device from the starting materials or during fabrication, and that are sealed inside the device encapsulation package during its initial construction. The getter material performing these functions may be within the cathode or electrode features.

The electrode could also be composed of a vertically non-uniform (in the direction parallel to the printed surface or electrode interface normal) or multilayered structure, such that the composition of the getter varies within the electrode. This can serve to isolate gettering materials that might damage the electrode interface region if in immediate contact, but may be beneficial if placed very close to these interface to perform its gettering function. It may also be that the getter may interfere with interfacial injection or charge transport in certain layers of a cathode or electrode. In that case, a multi-layer cathode with a low getter concentration at the interface or in a critical transport region of the electrode optimizes the electrical functions while the more heavily gettered layer provides the beneficial gettering action. The getter may also be included in ink or paste-derived interconnect lines which may be printed as part of the electrode or cathode itself, as one of the printed layers in a multilayer cathode, or as separated printed electrode interconnect features. Getter in these features serves to absorb impurities introduced into the device package in the ink or paste itself, and can also serve to absorb or block impurities ingressing into the device package from the outside environment through or near the electrode interconnect line. This is significant as electrode interconnect lines passing from the active device area within the package to the outside of the sealed part of the package can cause local channels in the encapsulation adhesives and barrier materials or the lines themselves can have a higher impurity transmission rate. Therefore it can be advantageous to include gettering materials in those lines also.

As noted above, the electrode structure of a device need not be uniform. For example, the electrode may be formed by more than one layer of ink or paste, where the getters used and their concentrations are different. The concentrations may vary uniformly between the interface with the active part of the device toward the opposite side or the electrode, but need not vary uniformly. In some cases, it may be desirable for the electrode paste in conduct with the active portion of the device to have no getter or a low concentration of getter, in order to avoid contamination of the active portion of the device.

The electrode paste of the present invention can include getters that react with or otherwise convert an unwanted residual component of the paste, or other unwanted species, into a more benign material. In some cases, such unwanted residual components or other unwanted species may be converted into another compound that is more volatile, has higher diffusivity, or is otherwise easier to remove or transport.

The use of a getter that during or after the processing removes the unwanted species can produce higher performance devices, and also allows for reduced environmental control of the process environment, thereby providing a simpler, and faster, manufacturing process, lower cost devices, and allows use of less expensive processing equipment.

Example 1

Tetraethylorthosilicate-Blended Silver Conductive Paste for Use as a Cathode for an Organic Light Emissive Device a. Preparation of tetraethyl orthosilicate (silate) blended silver (Ag) paste Into 99 g of a commercial silver paste consisting primarily of Ag flakes and particles, polymer binders, surfactants, and volatile solvents, was added 1 g tetraethyl orthosilicate (silane) to form 1% silane content in the paste. The paste was then mixed overnight at room temperature prior to printing.

b. Control: Fully Screen-Printed White Light-Emitting Devices with Standard Ag Cathodes A doped light-emitting polymer (LEP) ink (based on LEP provided by Sumation, a joint venture of Sumitomo Chemical and Cambridge Display Technology) was screen-printed onto a pre-patterned indium tin oxide (ITO)-coated polyethylene terephthalate (PET) substrate with an active area of 1 cm². After removing the solvents by heating the substrate under vacuum, a top electrode Ag standard silver paste was printed onto the LEP layer and dried to form the cathode and interconnect layer and complete the device fabrication. The device was then transferred into a nitrogen glove box and tested under a constant current density at 2 mA/cm². Both luminance (Cd/m²) and voltage (V) were recorded as function of time (FIG. 1). Maximum luminance (Lmax) was 326 Cd/m², maximum luminance efficiency (L.E.) was 16.3 Cd/A, and maximum power efficiency (P.E.) was 3.41 m/W. We have converted the lifetime at Lmax to lifetimes at 100 Cd/m² using an extrapolation $t_{1/2} \times (Lmax/100)^y$, where $t_{1/2}$ is the time to half maximum luminance Lmax, and y is an exponent generally varying from 1.2 to 2.1. For these fully screen-printed devices based on this type of LEP, this factor y has been found to be approximately 1.8. Thus, this device had a luminance lifetime (100 Cd/m²) of 2180 h when 1.8 y factor is used.

c. Fully Screen-Printed White Light-Emitting Devices with Silane-Blended Ag Cathodes A device was fabricated in a similar as described above for the control, by using the Ag-silane paste described above instead of Ag-standard paste. Its Lmax was 355 Cd/m², L.E. was 17.7 Cd/A, and P.E. was 3.61 m/W. This device had a luminance lifetime, at 100 Cd/m², of 3250 h extrapolated using a luminance vs. lifetime acceleration exponent of 1.8 (FIG. 1). This improvement in luminance lifetime follows similar improvements in devices dried using an external getter in close proximity to the cathode. This indicates that the Ag silane device had a better lifetime performance due to removal of moisture present in Ag paste by hydrolysis of the silane additive upon heating, while its silanol product did not have a compensating adverse impact on the device. This reduction in moisture in the cathode region can improve function and reduce degradation of the cathode. It can also create a diffusion gradient for water which then drives water out of the active region of the device (LEP containing areas in this example). Water-induced photooxidation of active layer components and dopant deactivation by moisture are both device performance degradation mechanisms which can be reduced in impact by the reduction of the moisture content in the active region. Note that photooxidation is also a performance degradation mechanism in photovoltaic, sensor, and switching devices. As indicated in the reaction in Scheme 1, one of the alkoxyl groups on the silane undergoes hydrolyzation with water, generating ethanol, which is more easily removed than water due to its higher vapor pressure or lower binding to the paste components during the LEP annealing process. Such hydrolysis reactions can continue between additional water and the silanol with remaining alkoxyl groups. Since ethanol can be removed effectively by thermal annealing, the hydrolysis reaction of silane becomes irreversible and water can be chemically removed, resulting in better device lifetime.

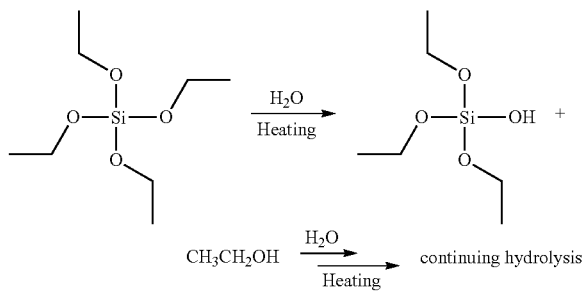

Scheme 1

Although the present invention has been particularly described with reference to embodiments thereof, it will be readily apparent to those of ordinary skill in the art that various changes, modifications and substitutes are intended within the form and details thereof, without departing from the spirit and scope of the invention. Accordingly, it will be appreciated that in numerous instances some features of the invention will be employed without a corresponding use of other features. Further, those skilled in the art will understand that variations can be made in the number and arrangement of components illustrated.

The invention claimed is:

1. A conductive electrode paste for forming an electrode of an electronic device, the electrode paste comprising:
    (a) a conductive metal;
    (b) a getter material that is capable of being temporarily inactive, of reduced activity, or latent acting when the conductive electrode paste is deposited, and is capable of being activated later by applying an activation technique, wherein the electrode is formed using a plurality of layers of the electrode paste, and wherein getter composition of the plurality of layers of electrode paste is different, and wherein a concentration of the getter material in a layer of electrode paste that is in contact with an active region of the electronic device is less than a concentration of the getter material in a layer of electrode paste that is not in contact with the active region; and
    (c) a binder material.

2. The electrode paste of claim 1, wherein the activation technique applied to activate the getter material after the conductive electrode paste is deposited is selected from the group consisting of thermal activation, optical activation, electrical activation, removal of a solvent that retards activity of the getter material, and protection of the getter material by a matrix that controls diffusion of contaminants to the getter material.

3. The electrode paste of claim 2, wherein the getter comprises from 0.01% to 10% by weight.

4. The electrode paste of claim 1, further comprising an organic solvent.

5. The electrode paste of claim 4, further comprising a surfactant.

6. The electrode paste of claim 4, wherein the getter material is temporarily inactive, of reduced activity, or latent acting when the electrode paste is deposited.

7. The electrode paste of claim 6, wherein the getter material is activated through a technique selected from the group consisting of thermal activation, optical activation, electrical activation, removal of a solvent that retards activity of the getter material, and protection of the getter material by a matrix that controls diffusion of contaminants to the getter material.

8. The electrode paste of claim 7, wherein the getter comprises from 0.01% to 10% by weight.

9. An electronic device including an active region, wherein the electronic device comprises an electrode formed using a conductive electrode paste comprising a conductive metal, a getter material, and a binder material, wherein the getter material is activated after the conductive electrode paste is deposited, and wherein a concentration of getter material in the electrode varies between an interface of the electrode with the active region of the device and an opposite side of the electrode.

10. The electronic device of claim 9, wherein the getter material is temporarily inactive, of reduced activity, or latent acting when the electrode paste is deposited.

11. The electronic device of claim 10, wherein the getter material is activated through a technique selected from the group consisting of thermal activation, optical activation, electrical activation, removal of a solvent that retards activity of the getter material, and protection of the getter material by a matrix that controls diffusion of contaminants to the getter material.

12. The electronic device of claim 11, wherein the getter comprises from 0.01% to 10% by weight.

13. The electronic device of claim 12, wherein the conductive electrode paste further comprises an organic solvent.

14. The electronic device of claim 13, wherein the conductive electrode paste further comprises a surfactant.

15. The electronic device of claim 9, wherein the device is an organic light emitting diode.

16. The electrode paste of claim 1, wherein the getter material converts an unwanted residual component of the electrode into a different material.

17. The electrode paste of claim 16, wherein the getter material reacts with the unwanted residual component of the paste to generate a compound that is more volatile, of higher diffusivity, or that is easier to remove or transport than the unwanted residual component.

18. The electronic device of claim 9, wherein the concentration of getter material is lower at the interface of the electrode with the active region of the device and higher on the opposite side of the electrode.

19. The electronic device of claim 9, wherein the electrode is formed using a plurality of layers of electrode paste and wherein the getter composition of the layers of electrode paste is different.

20. The electronic device of claim 19, wherein the concentration of getter material in a layer of electrode paste that is in contact with the active region is less than the concentration of getter material in a layer of electrode paste that is not in contact with the active region.

* * * * *